United States Patent [19]
Honjo et al.

[11] Patent Number: 5,528,535
[45] Date of Patent: Jun. 18, 1996

[54] SEMICONDUCTOR MEMORY DEVICE

[75] Inventors: Shigeru Honjo, Ohtsuki; Kazumasa Yanagisawa, Kokubunji; Kiyoshi Inoue, Tokyo, all of Japan

[73] Assignee: Hitachi, Ltd., Tokyo, Japan

[21] Appl. No.: 399,511

[22] Filed: Mar. 7, 1995

[30] Foreign Application Priority Data

Mar. 7, 1994 [JP] Japan .................................. 6-062108

[51] Int. Cl.⁶ .......................... G11C 11/22; G11C 11/406
[52] U.S. Cl. .................. 365/145; 365/222; 365/230.030; 365/149
[58] Field of Search .................................... 365/145, 149, 365/222, 230.03

[56] References Cited

U.S. PATENT DOCUMENTS

| | | | |
|---|---|---|---|
| 5,027,327 | 6/1991 | Kobayashi et al. | 365/222 |
| 5,299,168 | 3/1994 | Kang | 365/222 |
| 5,305,255 | 4/1994 | Rubinstein | 365/222 |
| 5,373,475 | 12/1994 | Nagase | 365/222 |
| 5,381,379 | 1/1995 | Fukumoto | 365/145 |
| 5,455,786 | 10/1995 | Taueuchi et al. | 365/145 |

FOREIGN PATENT DOCUMENTS

| | | |
|---|---|---|
| 3-5996 | 1/1991 | Japan . |
| 3-283079 | 12/1991 | Japan . |
| 3-283176 | 12/1991 | Japan . |

OTHER PUBLICATIONS

Technical Report (pp. 122–125)–Semiconductor World Dec. 1991 Application of Ferroelectric Thin Film to Integrated Circuits (pp. 1–10).

Primary Examiner—David C. Nelms
Assistant Examiner—Tan T. Nguyen
Attorney, Agent, or Firm—Antonelli, Terry, Stout & Kraus

[57] ABSTRACT

A memory matrix—which comprises memory cells arranged in matrix, each made up of a ferroelectric capacitor and an address selection MOSFET—is divided for each word line into a plurality of memory blocks. Each of the memory blocks is provided with a mode storage circuit that stores a DRAM mode (volatile mode) or NV mode (non-volatile mode) in one-to-one correspondence for each memory block, and with a refresh operation count circuit that counts for each memory block the number of times the refresh operations is performed consecutively. During an n-th refresh operation (where n is a predetermined number of times), a memory access is made to temporarily change the plate voltage of the ferroelectric capacitor from one voltage to another and at the same time the mode storage circuit is changed from the DRAM mode to the NV mode. When a read or write operation to and from a memory cell in the memory block is performed, the mode storage circuit is changed from the NV mode to the DRAM mode. The refresh operation is omitted for the memory block that was set to the NV mode according to the stored information in the mode storage circuit.

6 Claims, 10 Drawing Sheets

SEMICONDUCTOR MEMORY DEVICE

BACKGROUND OF THE INVENTION

The present invention relates to a semiconductor memory device and more specifically to a technique suitably applied to a semiconductor memory device using a memory cell formed of a ferroelectric capacitor and an address selection MOSFET.

Examples of semiconductor memory devices, that use ferroelectric capacitors as memory cells and which can switch between a non-volatile mode and a volatile mode, include Japanese Patent Laid-Open Nos. 5996/1991, 283079/1991 and 283176/1991.

The inventor of this invention has invented a semiconductor memory device with a novel function, which considers drawbacks that a major part of the current consumption in DRAM (dynamic RAM) is used in the refresh operation and that the polarization characteristic of the ferroelectric memory using the ferroelectric capacitor deteriorates as the number of rewriting operations increases and which solves these two drawbacks by combining them together.

SUMMARY OF THE INVENTION

An object of this invention is to provide a semiconductor memory device which has a low power consumption and virtually eliminates a limit to the number of rewriting operations.

These and other objects and novel features of this invention will become apparent from the following description in this specification and the accompanying drawings.

Representative aspects of the invention may be briefly summarized as follows. A memory matrix—which comprises memory cells arranged in matrix, each made up of a ferroelectric capacitor and an address selection MOSFET— is divided for each word line into a plurality of memory blocks. Each of the memory blocks is provided with a mode storage circuit that stores a DRAM mode (volatile mode) or NV mode (non-volatile mode) in one-to-one correspondence with each memory block, and with a refresh operation count circuit that counts for each memory block the number of times the refresh operations is performed consecutively. During an n-th refresh operation (where n is a predetermined number of times), a memory access is made to temporarily change the plate voltage of the ferroelectric capacitor from one voltage to another and at the same time the mode storage circuit is changed from the DRAM mode to the NV mode. When a read or write operation to and from a memory cell in the memory block is performed, the mode storage circuit is changed from the NV mode to the DRAM mode. The refresh operation is omitted for the memory block that was set to the NV mode according to the stored information in the mode storage circuit. This operation allows a substantial reduction in power consumption and polarization is reversed only at time of switching to the NV mode, so that the limit on the number of rewriting operations can be virtually eliminated.

With the above-mentioned means, because the memory block which is not accessed is set to an NV mode in which the refresh operation is omitted, a substantial reduction in power consumption is realized. Further, because the polarization is reversed only at time of switching into the NV mode, the limit to the number of rewriting operations can be virtually eliminated.

DETAILED DESCRIPTION OF THE INVENTION

Figure 1:
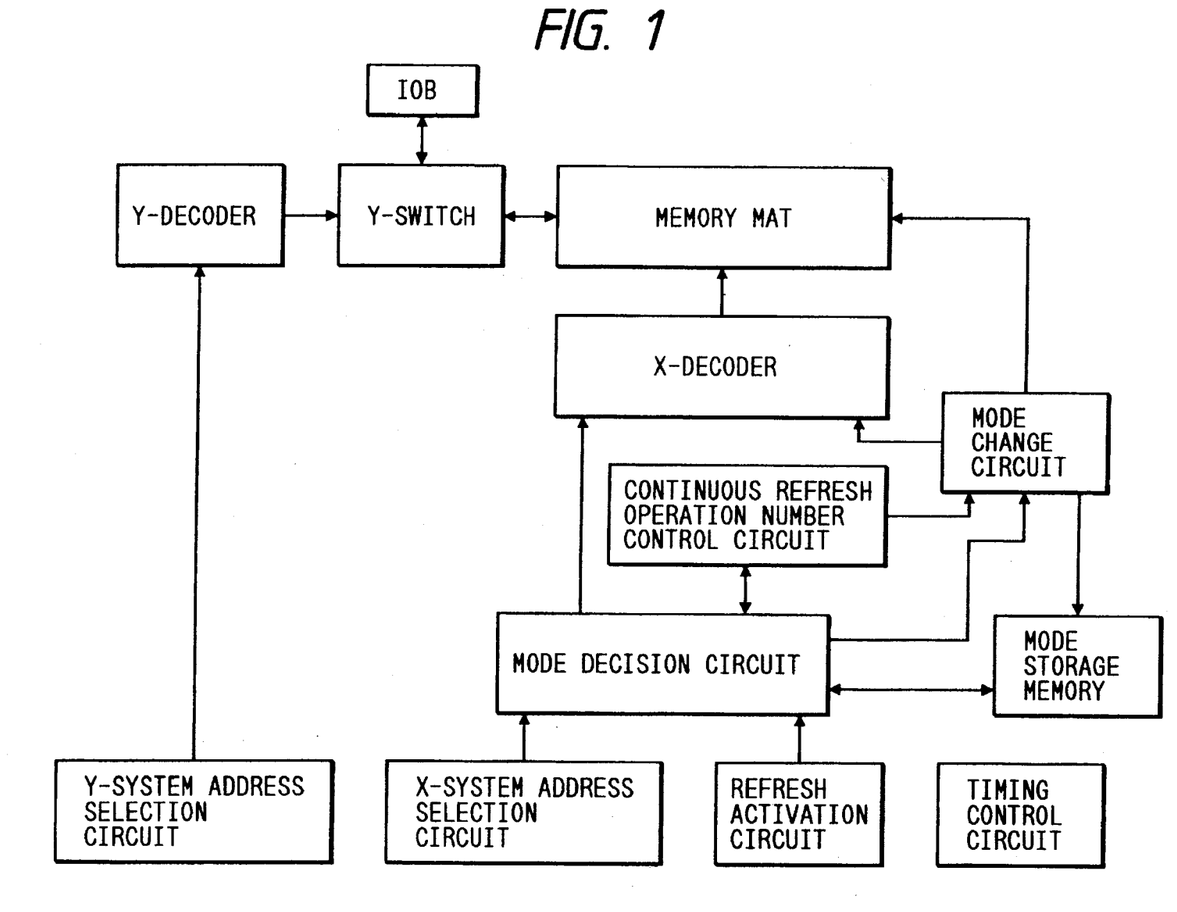
FIG. 1 is a functional block diagram showing an embodiment of the semiconductor memory device of this invention.

FIG. 1 shows a functional block diagram of the semiconductor memory device as one embodiment of this invention. Circuit blocks in the diagram are each manufactured on a single semiconductor substrate of, say, monocrystalline silicon by a known semiconductor integrated circuit fabrication technique. The semiconductor memory device of this embodiment basically comprises a conventional dynamic RAM (simply referred to as DRAM)—which includes a memory matrix (or memory cell array), an X-decoder, a Y-decoder, a Y-switch, a refresh activation circuit, an X-system address selection circuit and a Y-system address selection circuit—and also a continuous refresh operation number control circuit, a mode change circuit, a mode storage memory and a mode decision circuit. Ferroelectric capacitors are used as information storage capacitors of memory cells.

The memory matrix uses ferroelectric capacitors for information storage capacitors making up memory cells. In other respects, the memory matrix has the similar configuration to a known dynamic RAM memory matrix or memory array. It is understood that the memory matrix includes associated sense amplifiers and bit line precharge circuits.

The ferroelectric capacitor is formed by a known method, i.e., by depositing a ferroelectric substance of, say, PZT over an electrode that forms a storage node of a capacitor making up a dynamic memory cell and then by forming an upper electrode of, say, Pt. The ferroelectric substance may be $BaMgF_4$. The method of forming such a ferroelectric layer is detailed in the journal "Semiconductor World" December issue, 1991, pp. 122–125.

The X-system address selection circuit is an X-system address buffer, which takes in and holds an address signal supplied in synchronism with a row address strobe signal. The Y-system address selection circuit is a Y-system address buffer, which takes in and holds an address signal supplied in synchronism with a column address strobe signal.

The X-decoder decodes an X-system address signal to select a word line in the memory matrix. The X-decoder includes a word driver that drives a word line. The Y-decoder decodes a Y-system address signal to form a column selection signal for complementary data lines (or bit lines) in the memory matrix and thereby control the Y-switch. The Y-switch connects complementary data lines selected by the column selection signal to an input/output circuit IOB.

The timing control circuit, in response to a row address strobe signal, a column address strobe signal and a write enable signal received, distinguishes between write, read and refresh operation modes and forms an internal timing signal corresponding to the mode. The refresh activation circuit includes an address counter and outputs a refresh address to the X-decoder during the refresh mode.

In a memory device that employs an external interface where the X- and Y-system address signals are input from independent external terminals as in a static RAM, rather than using an address multiplex system as in a dynamic RAM, the timing control circuit receives a chip select signal, a write enable signal and an output enable signal. The refresh activation circuit is provided with a timer circuit, which, when the refresh control terminal is held to an active level, produces pulses to activate a refresh operation periodically. That is, this configuration is similar to a known pseudo-static RAM which uses dynamic memory cells for the memory matrix while at the same time providing the external interface compatible with the static RAM.

In a semiconductor memory device having the configuration similar to the above-mentioned dynamic RAM or pseudo-static RAM, the limit on the number of rewriting operations that result in inverted polarization of the ferroelectric capacitor is virtually eliminated and the current consumption accompanying the refresh operation in the dynamic RAM is substantially reduced by using ferroelectric capacitors for memory cells and by adding the following circuits.

The memory matrix made up of memory cells arranged in matrix, each consisting of a ferroelectric capacitor and an address selection MOSFET, is divided into a plurality of memory blocks each having one or two word lines. Mode storage memories are provided in one-to-one correspondence for these memory blocks. There are two modes: a DRAM mode (volatile mode) and an NV mode (non-volatile mode). Hence, each memory block is assigned one bit information for the mode specification. The mode storage memory may, for example, be formed of a static memory circuit.

The continuous refresh operation number control circuit counts the refresh operations on each memory block. When a memory cell contained in each memory block is written into or read from, the count value of the refresh operations is reset (cleared). That is, the refresh operation number control circuit keeps track of how many times the refresh operation has been performed consecutively in each memory block.

When the refresh operation is to be performed by the refresh activation circuit, the mode decision circuit reads the mode information stored in the mode storage memory according to the refresh address signal to determine whether a memory block containing the word line to be refreshed is in the DRAM mode or NV mode. If it is in the DRAM mode, the refresh operation is performed incrementing the count value of the continuous refresh operation number control circuit. If it is in the NV mode, the refresh operation is omitted. That is, the word line selection operation by the X-decoder and the activation of sense amplifier are not performed.

When the X-system address selection circuit makes a memory access for writing or reading, the mode decision circuit resets to zero the refresh operation number in the continuous refresh operation number control circuit for the corresponding memory block and at the same time changes the mode storage memory to the DRAM mode through the mode change circuit. This mode change can be omitted when the memory block is in the DRAM mode. The memory access for write or read operation involves, as in the conventional dynamic RAM or pseudo-static RAM, selecting a word line of the memory matrix by the X-decoder, activating a sense amplifier, selecting a Y-switch by the Y-decoder and, in the case of writing via the input/output buffer IOB, charging up the ferroelectric capacitor of the selected memory cell to a high or low level corresponding to the write information, or, in the case of reading, outputting a signal amplified by the sense amplifier through the input/output buffer IOB.

When the predetermined number of refreshing operations has been performed, the continuous refresh operation number control circuit specifies a mode change to the mode change circuit. The mode change circuit at time of the refresh operation temporarily raises the plate voltage of the memory matrix from a low level of, for example, ground potential of the circuit to a high level of, say, power supply voltage VCC to perform a write operation resulting in reversed polarization of the ferroelectric capacitor. And then an NV mode is stored in the mode storage memory. For a memory block containing a plurality of word lines, the plate voltage is temporarily changed, as mentioned above, during selection of all word lines for refresh operations to switch all memory cells to the NV mode.

Figure 2:
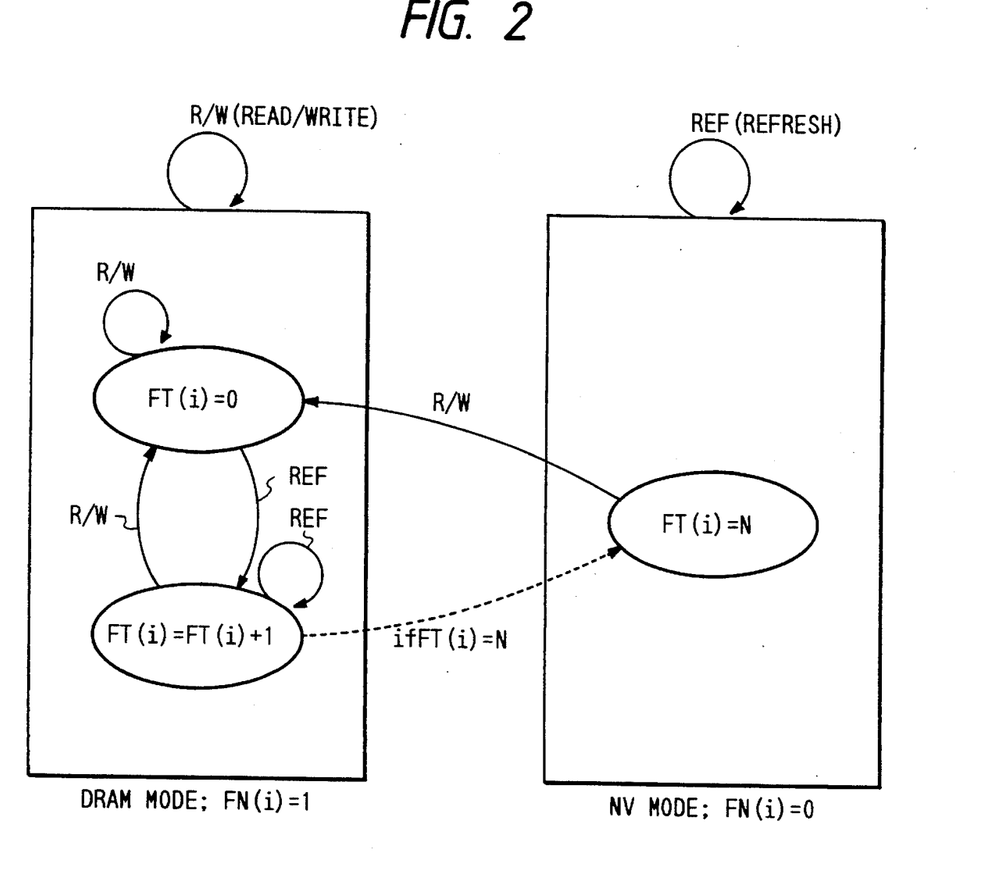
FIG. 2 is a state transition diagram used to explain the mode change operation in the semiconductor memory device of this invention.

FIG. 2 shows a state transition diagram used to explain the mode change operation in the semiconductor memory device of this invention. Mode information FN(i) in the mode storage memory that corresponds to an i-th memory block among the plurality of divided memory blocks or, when the memory block is identified by word lines, to an i-th word line is set to "1" (high level) when the block is in the DRAM mode or to "0" (low level) when it is in the NV mode.

In the DRAM mode, each time a read/write (W/R) operation is performed, the continuous refresh operation count FT(i) is reset or cleared to zero. Each time a refresh (REF) operation is performed, the continuous refresh operation count FT(i) is incremented by 1. If there is no R/W operation performed between one refresh operation and the next, the continuous refresh operation count FT(i) is successively incremented. During this period, because the memory block is in the DRAM mode, the refresh operation is performed normally. That is, a word line is selected; information stored in the selected memory cell is put out on the complementary data lines; and the sense amplifier is activated to amplify a small potential difference between the complementary data lines to the voltage difference between the power supply voltage and the ground potential of the circuit and restore the amplified voltage in the storage capacitor.

When the continuous refresh operation count $FT(i)$ reaches a predetermined value N, the mode is changed to the NV mode, that is, the mode information $FN(i)$ is changed from 1 to 0. In this N-th refresh operation, as the mode is changed to the NV mode, a word line is selected, as described later, and the sense amplifier is activated to temporarily change the plate voltage of the ferroelectric capacitor from a ground potential of the circuit to a power supply voltage—with the potentials of the complementary data lines connected to the memory cells set to a high level of the power supply voltage and to a low level of the ground potential of the circuit—to perform a write operation resulting in inverted polarization of the capacitor.

Thereafter, even when a refresh operation on the i-th memory block (word line) is triggered, the refresh operation on that memory block is omitted. That is, neither the word line selection nor the activation of the sense amplifier is performed, except that the refresh address is updated. While in the figure, the continuous refresh operation count $FT(i)$ in the NV mode is maintained at N, this count value has no meaning and may virtually be cleared to zero with elapse of time in the case of memory blocks that use dynamic memory cells as the memory circuits.

When a R/W memory access is made to the i-th memory block (or word line), which is set in the NV mode, the memory block in question is changed to the DRAM mode and the continuous refresh operation count $FT(i)$ is set to zero. Then, the write or read operation similar to one described above is performed.

Figure 3:
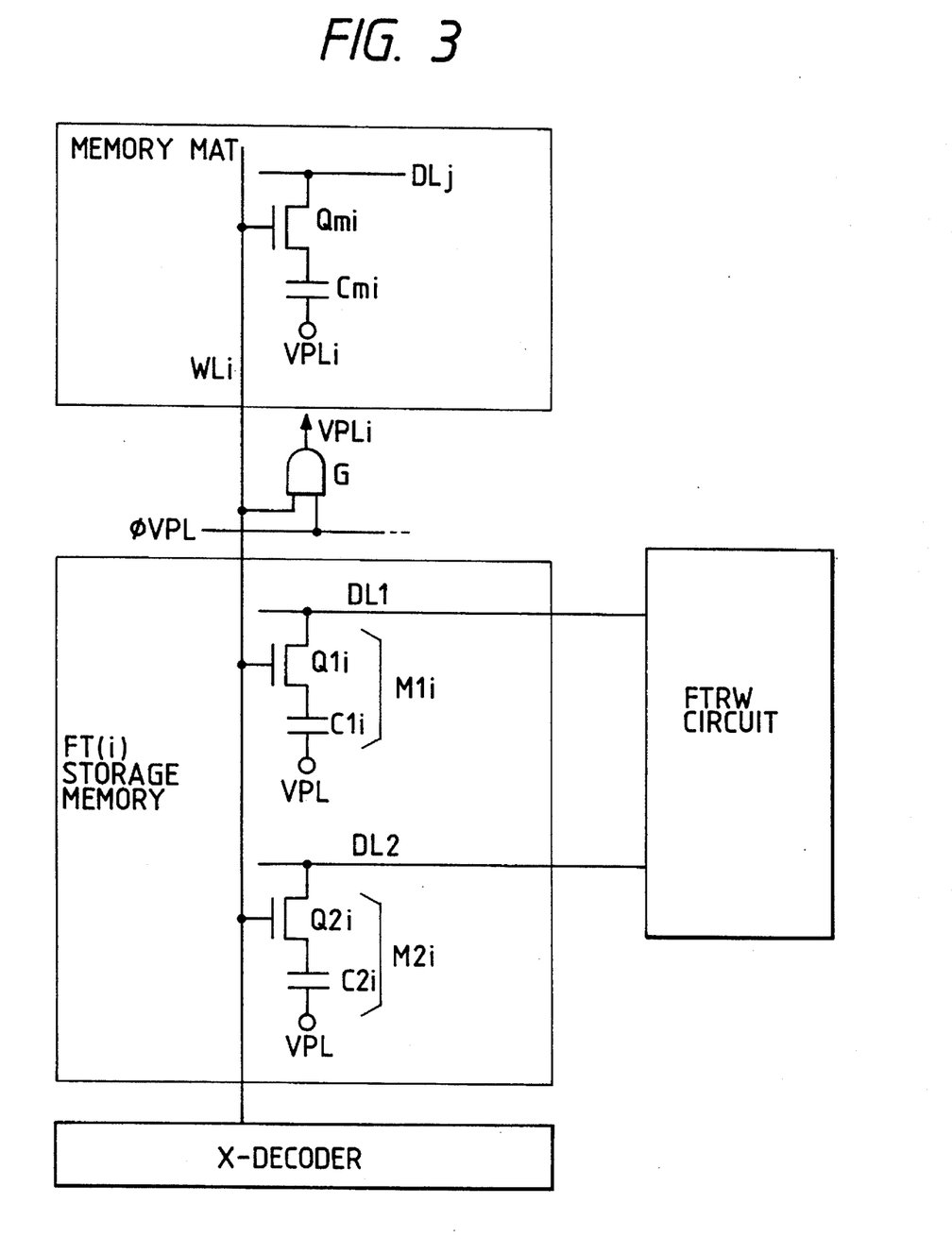
FIG. 3 is an outline block diagram showing, as one embodiment of this invention, a memory matrix and a continuous refresh operation number control circuit in the semiconductor memory device of this invention.

FIG. 3 shows as one embodiment an outline block diagram of the memory matrix and the continuous refresh operation number control circuit in the semiconductor memory device of this invention. This embodiment concerns a case where the memory matrix is divided for each word line, and the figure representatively shows a circuit corresponding to an i-th word line WLi.

In this embodiment, the continuous refresh operation number control circuit is provided with a plurality of dynamic memory cells on the same word line WLi as in the memory matrix which work as a continuous refresh operation count storage circuit. For example, if the refresh operation is supposed to be performed three times consecutively, two memory cells M1i and M2i are provided as a memory for storing the continuous refresh operation count $FT(i)$. These memory cells M1i, M2i are each formed of an address selection MOSFET and a storage capacitor. Because in this embodiment capacitors C1i, C2i are used as dynamic memory cells, they need not be ferroelectric capacitors. But, since the manufacturing process for the storage capacitor Cmi of the memory matrix can be utilized, they are formed of ferroelectric capacitors.

The memory cells M1i, M2i are each connected to first complementary data lines DL1, DL2. These first complementary data lines DL1, DL2 are each provided with second complementary data lines /DL1, /DL2 (not shown) running parallel to the first lines. An FTRW circuit is a control circuit that reads the count stored in the memory cells M1i, M2i and increments it by 1 and restores the result in the memory cells M1i, M2i. For such a read operation, the complementary data lines are provided with similar sense amplifiers to those used in the memory matrix.

To describe in more detail, the sense amplifiers in the FTRW circuit sense and amplify, as described above, a small voltage read from the memory cells M1i, M2i onto the complementary data lines DL1, DL2 according to the selected state of the word lines WLi during the refresh operation, with a half precharge voltage of the second complementary data lines /DL1, /DL2 (not shown) taken as a reference voltage. This amplified signal is incremented by 1 by an addition circuit and restored into the memory cells M1i, M2i. The FTRW circuit, on the other hand, when the word line is selected during the write/read operation, ignores the read signal and writes zero (low level) into the both memory cells M1i, M2i, thus resetting them.

At the third refresh operation in which the stored information in the memory cells M1i and M2i are both 1, a timing pulse $\phi VPL$ is generated and applied to one input of a gate circuit G—whose second input is supplied a word line WLi selection signal—to temporarily hold high the plate voltage VPLi of a ferroelectric capacitor Cmi corresponding to the word line WLi being refreshed. As a result, at the third consecutive refresh operation, the memory cells connected to the word line WLi have the direction of their polarization determined according to the stored information when being rewritten. That is, the memory cells connected to the word line WLi are written as FRAM. Thereafter, as long as only the refresh operation continues, the mode change to the nonvolatile mode omits the refresh operations.

Changing to the NV mode immediately after the third consecutive refresh operation, however, results in very frequent switching between DRAM mode and NV mode, which will bring to an unnegligible level the characteristic deterioration accompanying the polarization reversal performed at time of switching to the NV mode. Hence, in practice, the number of continuous refresh operations before the switch to the NV mode is set to 127, 255 or 511 times. For instance, when the number is 127 times, the $FT(i)$ storage memory section is provided with seven such memory cells; when it is 255 times, eight such memory cells are provided; and when it is 511 times, nine such memory cells are provided.

Figure 4:
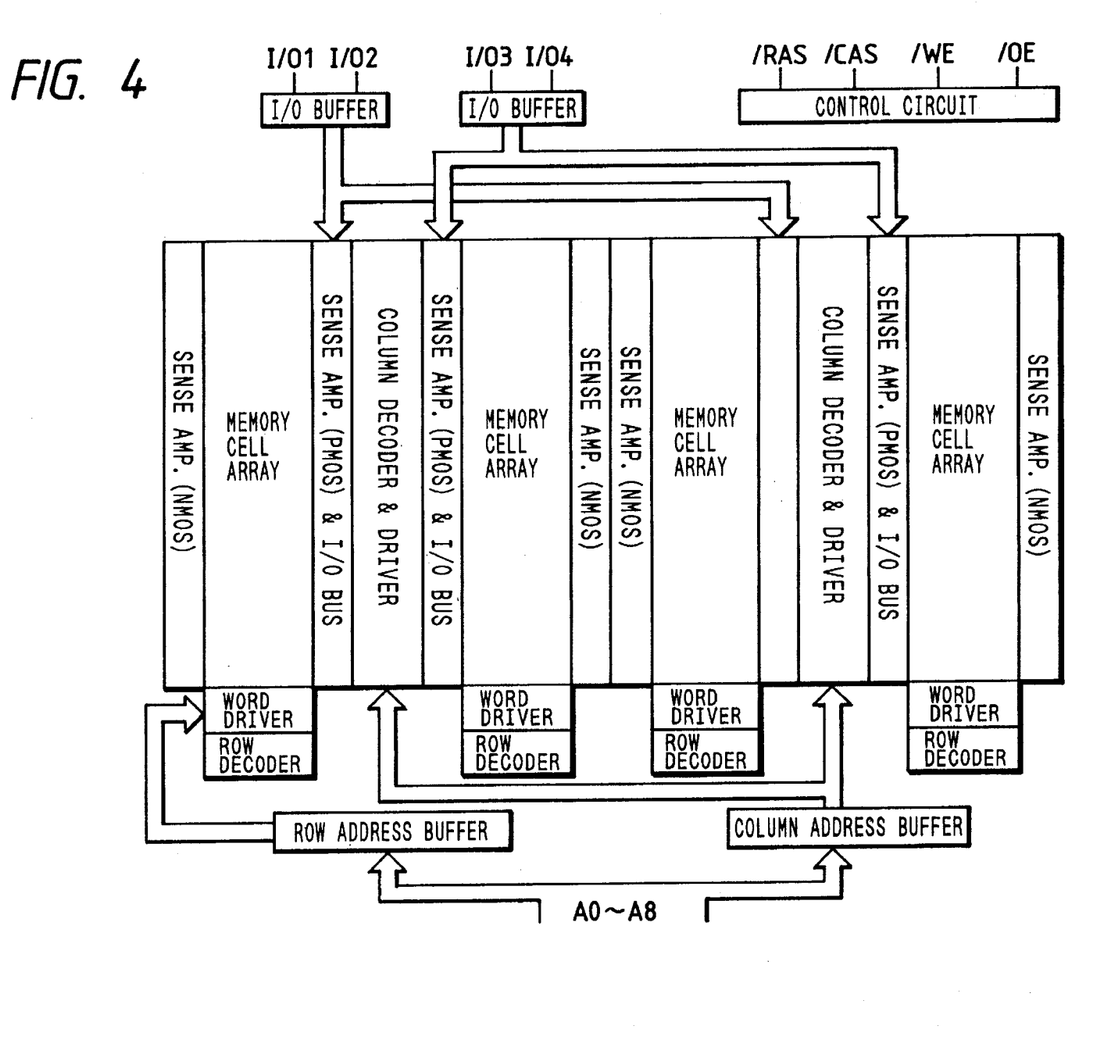
FIG. 4 is a block diagram of one embodiment of the semiconductor memory device applying this invention.

FIG. 4 shows an example block diagram of one embodiment of the semiconductor memory device applying this invention. In this embodiment, the external interface is compatible with the dynamic RAM.

In this embodiment, the memory matrix comprises four memory cell arrays, with an N-channel MOSFET (NMOS) and a P-channel MOSFET (PMOS) forming sense amplifiers being arranged separated on each side of the individual memory cell arrays. The four memory cell arrays are divided into two groups of two memory cell arrays, with a column decoder and a driver disposed between the two memory cell arrays in each group for common use. Adjacent to the column decoder and the driver is provided an input/output bus, which is understood to include the Y-switch.

The row address buffer takes in address signals A0–A8 supplied in synchronism with a row address strobe signal /RAS and sends them to the row decoder. Four row decoders are provided in one-to-one correspondence for the four memory cell arrays. The address signal sent from the row address buffer to the decoder, though not shown, is transmitted through an address bus that passes through the four row decoders in series. A word driver drives a word line selected by the output signal from the row decoder.

The column address buffer takes in address signals A0–A8 supplied in synchronism with a column address strobe signal /CAS and sends them to the column decoder. The column decoder connects the complementary data lines of a memory cell array selected by controlling the Y-switch through the driver to the input/output bus. In the write operation, the write signal input from the external terminals I/01–I/04 is selected by each memory cell array through the I/O buffer, input/output bus, Y-switch and complementary data lines and then written into each memory cell. In the read operation, the stored information in a memory cell selected in each memory array is output through the complementary data lines, sense amplifier, Y-switch, input/output bus, input/output buffer and external terminals I/01–I/04.

The control circuit, in response to the control signals /RAS, /CAS, write enable signals /WE and output enable signal /OE, determines the operation mode, such as write, read or refresh operation, and generates a timing pulse corresponding to each mode.

The control circuit is provided with the refresh activation circuit, mode decision circuit, continuous refresh operation number control circuit, mode storage memory and mode change circuit. The word driver includes a plate voltage drive circuit as part of the mode change circuit.

Figure 5:
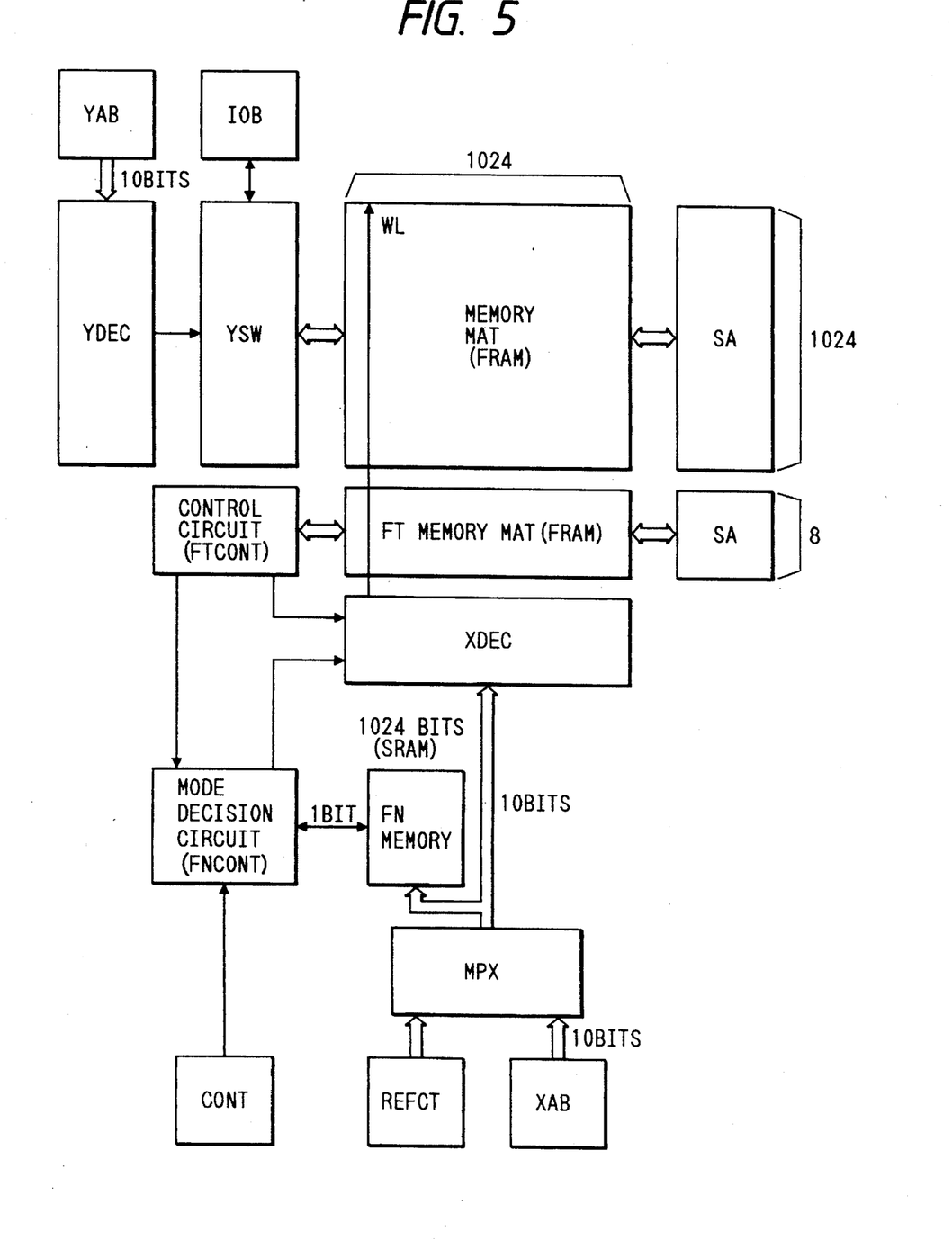
FIG. 5 is an overall block diagram of one embodiment of the semiconductor memory device applying this invention.

FIG. 5 shows an entire block diagram of one embodiment of the semiconductor memory device of this invention. Each of the circuit blocks in the diagram is formed on a semiconductor substrate of, say, a monocrystalline silicon, as in the previous embodiment, by a known semiconductor integrated circuit fabrication technique.

The memory matrix may be formed to have a storage capacity of 1024×1024 (about 1M bits). In other words, the memory matrix comprises 1024 word lines and 1024 pairs of complementary data lines. 1024 sense amplifiers are provided in one-to-one correspondence for the 1024 pairs of complementary data lines. The Y-switch YSW selects one pair of complementary data lines from among the 1024 pairs and connects it to the input/output buffer IOB.

This embodiment is provided with an FT memory matrix adjacent to the memory matrix to store the continuous refresh operation count, as in the previous embodiment of FIG. 3. In this embodiment, the memory matrix is divided for each word line WL into memory blocks. Hence, the FT memories for storing the continuous refresh operation count are provided for each word line. In this embodiment, The FT memory has eight bits to cause the mode to switch to the NV mode when the refresh operation is performed 255 times consecutively. The FT memory matrix therefore has a configuration of 1024×8 with eight sense amplifiers SA as in the memory matrix.

The read signal from the FT memory matrix, during the refresh operation, is fed to the control circuit FTCONT which adds +1 to the read signal and writes the added result into the same memory cell thus updating the continuous refresh operation count. During the write or read operation, the control circuit FTCONT clears the stored information in the corresponding memory cell to all zero. When the stored information in the eight memory cells are all 1, i.e., when 255 refresh operations have been performed consecutively, the control circuit FTCONT specifies a switch to NV mode to a mode decision control circuit FNCONT described later, and causes the X-decoder XDEC to generate a one-shot pulse temporarily holding the plate voltage of the ferroelectric capacitor to a high level of power supply voltage to perform rewriting in the NV mode.

An address signal generated by a refresh address counter contained in the refresh control circuit REFCT and an output signal of an X-address buffer XAB that takes in an X-system address signal from external circuit are taken into the internal circuit through a multiplexer MPX. That is, during the normal write/read operation, the multiplexer MPX transmits the address signal from the X-address buffer XAB to the X-decoder XDEC. During the refresh operation, the multiplexer MPX sends the refresh address signal generated by the refresh control circuit REFCT to the X-decoder XDEC.

In this embodiment, the output of the multiplexer MPX is provided with an FN memory to store mode information of the memory cells connected to each word line. This embodiment uses a static memory cell (static flip-flop circuit) for the FN memory. For the above-mentioned mode setting by individual word lines, 1024 memory cells whose number corresponds to the number of word lines and the selection circuit are provided.

The FN memory decodes an address signal supplied through the multiplexer MPX during the refresh mode, reads the mode information and feeds it to the mode decision control circuit FNCONT. The mode decision control circuit FNCONT, when the read signal is 0 representing the NV mode, outputs a signal to the X-decoder to disable it. This disables the selection of word line in the NV mode and the activation of sense amplifiers.

The mode decision control circuit FNCONT, when the switch to the NV mode is specified from the control circuit FTCONT, writes 0 into the selected FN memory. Further, when a read or write operation is specified from the timing control circuit CONT, the mode decision control circuit FNCONT writes 1 into the corresponding FN memory to switch the mode to the DRAM mode. In addition to the above operations, the timing control circuit CONT determines the mode, such as read, write or refresh mode, according to the control signal supplied from the outside and generates a corresponding timing signal.

A Y-address buffer YAB takes in a Y-system address signal and sends it to the Y-decoder YDEC. The Y-decoder YDEC decodes the Y-address signal to generate a Y-selection signal to control the Y-switch, thereby writing the write signal supplied through the input/output buffer IOB into the selected memory cell in the memory matrix in the case of write operation and, in the case of read operation, outputting through the input/output buffer IOB the stored information in the memory cell amplified by the selected sense amplifier.

Next, by referring to FIGS. 6, 7, 8A, 8B, 9, 10A and 10B, the operation of switching from the DRAM mode to the NV mode will be described.

Figure 6:
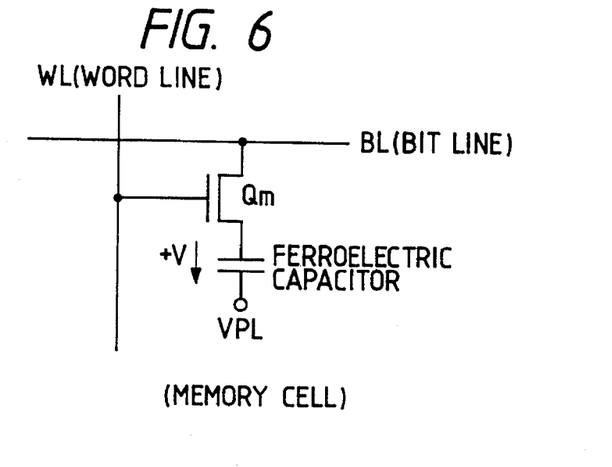
FIG. 6 is a circuitry of a memory cell using a ferroelectric capacitor in the semiconductor memory device of this invention.

FIG. 6 shows the circuitry of a memory cell using a ferroelectric capacitor in the semiconductor memory device of this invention. In the memory cell in the figure, the information storage capacitor of the known dynamic memory cell is formed of a ferroelectric capacitor. It is noted, however, that the plate voltage VPL is not fixed but is changed according to the operation mode. The direction of polarization of the ferroelectric capacitor is determined such that the direction as seen from the switch MOSFETQm side or the storage node side as indicated by the arrow is taken to be a positive polarity.

Figure 7:
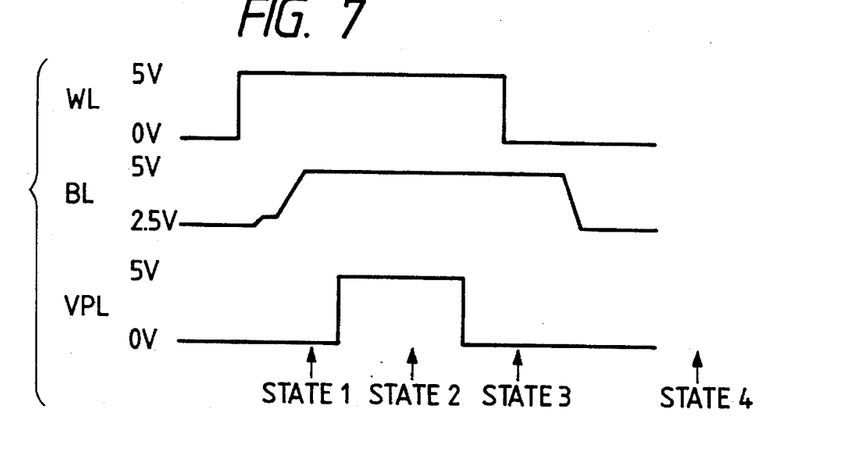
FIG. 7 is operation waveforms when a memory cell of FIG. 6 storing a high level is switched to the nonvolatile mode.
Figure 8A:
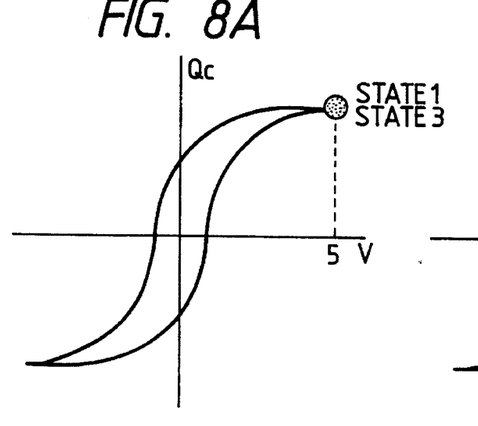
FIG. 8A and 8B are polarization behaviors in the hysteresis characteristic of a ferroelectric film corresponding to FIG. 7.
Figure 8B:
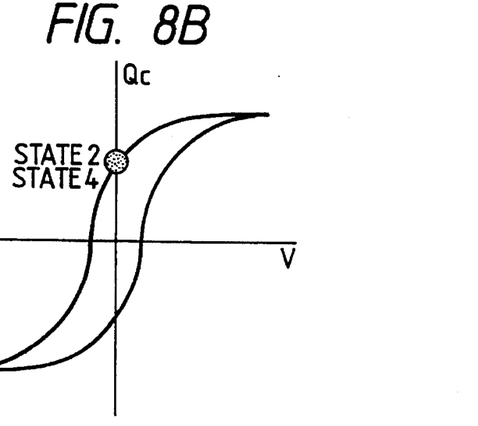

FIG. 7 shows operation waveforms when a memory cell storing a high level is switched to the nonvolatile mode. FIGS. 8A and 8B show the polarization behaviors in the hysteresis characteristic of the ferroelectric film. With a high level stored in a memory cell as described above, when a word line is selected, a small stored information appearing on the bit line (or data line) BL is amplified by the sense amplifier to a high level of 5 V as in the refresh operation.

In this state, the ferroelectric film is polarized corresponding to 5 V, as represented by the state 1 of the characteristic diagram of FIG. 8A.

With the bit line BL held high as mentioned above, the plate voltage VPL is changed to the same 5-V high level. In this state 2, because the ferroelectric film is supplied the same potential, a polarization corresponding to the voltage 0 V occurs as shown in FIG. 8(B).

When the plate voltage VPL is returned to the low level, the ferroelectric film is applied the 5 V again producing the polarization as shown in state 3. This means that the similar polarization is produced by the voltage held in the storage node even when the word line WL is deselected to the low level. That is, because the switch to the NV mode leaves the previous polarization state unchanged, the polarity reversal which reverses the direction of polarization does not occur.

In such an NV mode, because the refresh operation is not performed thereafter, the leakage current reduces the potential of the storage node to a low level as shown at state 4, so that the ferroelectric film is no longer applied a voltage, leaving the information retained by the residual polarization, as shown in state 4 of FIG. 8(B).

Figure 9:
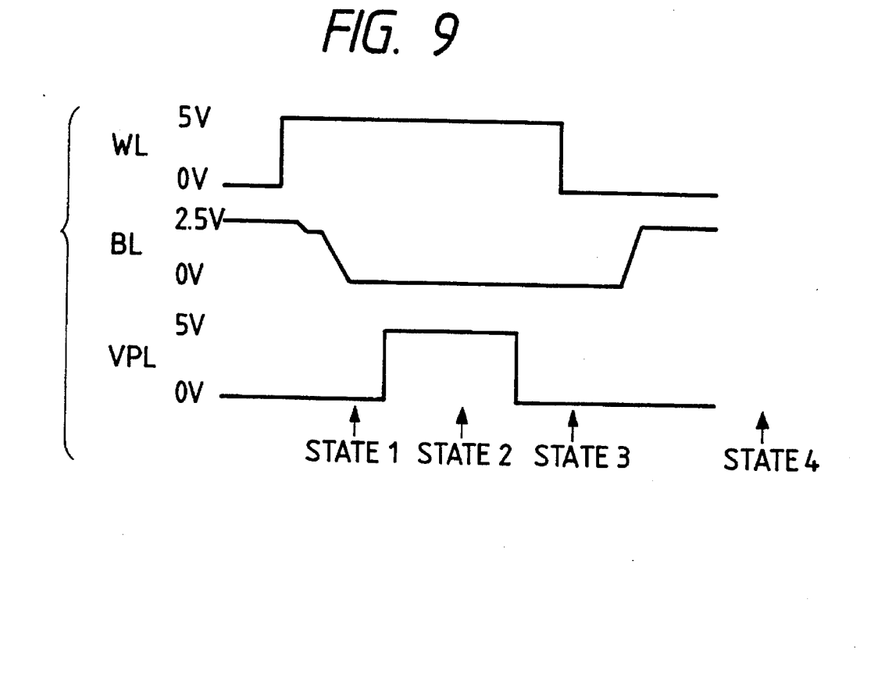
FIG. 9 is operation waveforms when a memory cell of FIG. 6 storing a low level is switched to the NV mode.
Figure 10A:
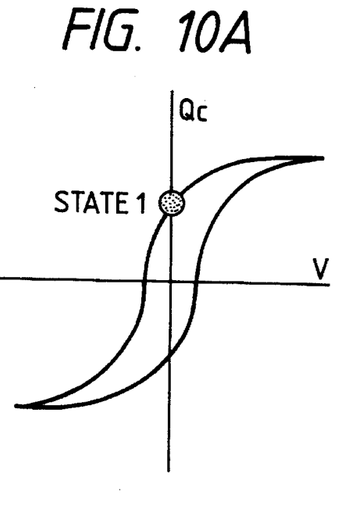
FIGS. 10A and 10B are polarization behavior in the hysteresis characteristic of a ferroelectric film corresponding to FIG. 9.
Figure 10B:
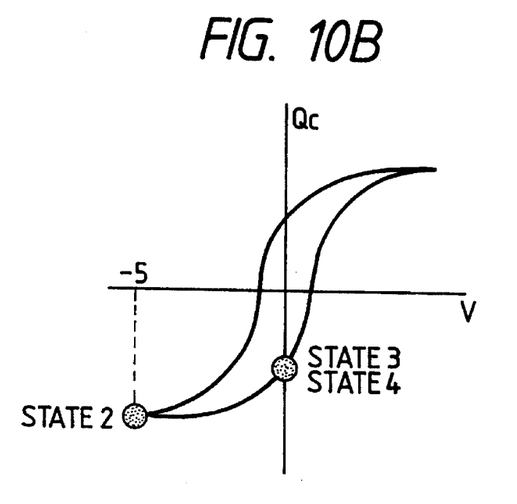

FIG. 9 shows operation waveforms when a memory cell storing a low level is switched to the NV mode. FIGS. 10A and 10B show the polarization behaviors in the hysteresis characteristic of the ferroelectric film. In operating the memory cell having a positive polarization in the DRAM mode, when, with a memory storing a low level, a word line is selected, a small stored information appearing on the bit line BL is amplified by the sense amplifier to a low level of 0 V as in the refresh operation. In this state 1, because the ferroelectric film is applied the same 0 V, there is a polarization corresponding to 0 V as shown in state 1 of the characteristic diagram of FIG. 10(A).

With the bit line BL set to low level as mentioned above, the plate voltage VPL is changed to the same 5-V high level. In this state 2, because the ferroelectric film is applied −5 V as seen from the storage node side, a polarization is reversed corresponding to the voltage of −5 V as shown in FIG. 10B.

When the plate voltage VPL is returned to the low level, the ferroelectric film is applied the same 0 V and there is a polarization as shown in state 3 corresponding to a negative, not positive, residual polarization because of the above reversal of polarization. This means that the similar polarization is produced by the 0 V retained in the storage node even when the word line WL is deselected to low level. In such an NV mode, because the refresh operation is not performed thereafter, the leakage current reduces the potential of the storage node to the low level as shown at state 4, so that the ferroelectric film is no longer applied a voltage, maintaining the negative residual polarization as shown in state 4 of FIG. 10B.

Therefore, when a word line is selected by the read operation, if the memory state is as shown at state 4 of FIG. 7, a small high level corresponding to the residual polarization and with respect to a half precharge voltage of 2.5 V as a reference voltage is output to the bit line. If the memory state is as shown at state 4 of FIG. 9, a small low level is output. The high or low level of output is amplified by the sense amplifier and the amplified high or low level is rewritten into the ferroelectric capacitor, so that a read signal corresponding to the direction of polarization, as shown in state 1 of FIG. 8A or state 2 of FIG. 10B, can be obtained. Thereafter, the operation is performed as the DRAM mode.

In the DRAM mode because the plate voltage VPL is fixed to the ground potential of the circuit, the high or low level information is stored by the positive or negative polarization. That is, the ferroelectric capacitor performs as a simple capacitor.

In this embodiment, if the memory access is not performed for a specified period of time, all the word lines are changed to the NV mode as mentioned above, so that the information can be retained even if no refresh operation is performed at all. This virtually reduces to zero the current consumption during the battery backup. If all the word lines are changed to the NV mode by not performing the read/write operation for a specified period as mentioned above, the information can be retained even when power is cut off. Rather than waiting for a specified period to elapse as described above, it is also possible to provide an operation mode which causes a forced switch to the NV mode after one cycle of refresh operation and to cut off power supply.

Figure 11:
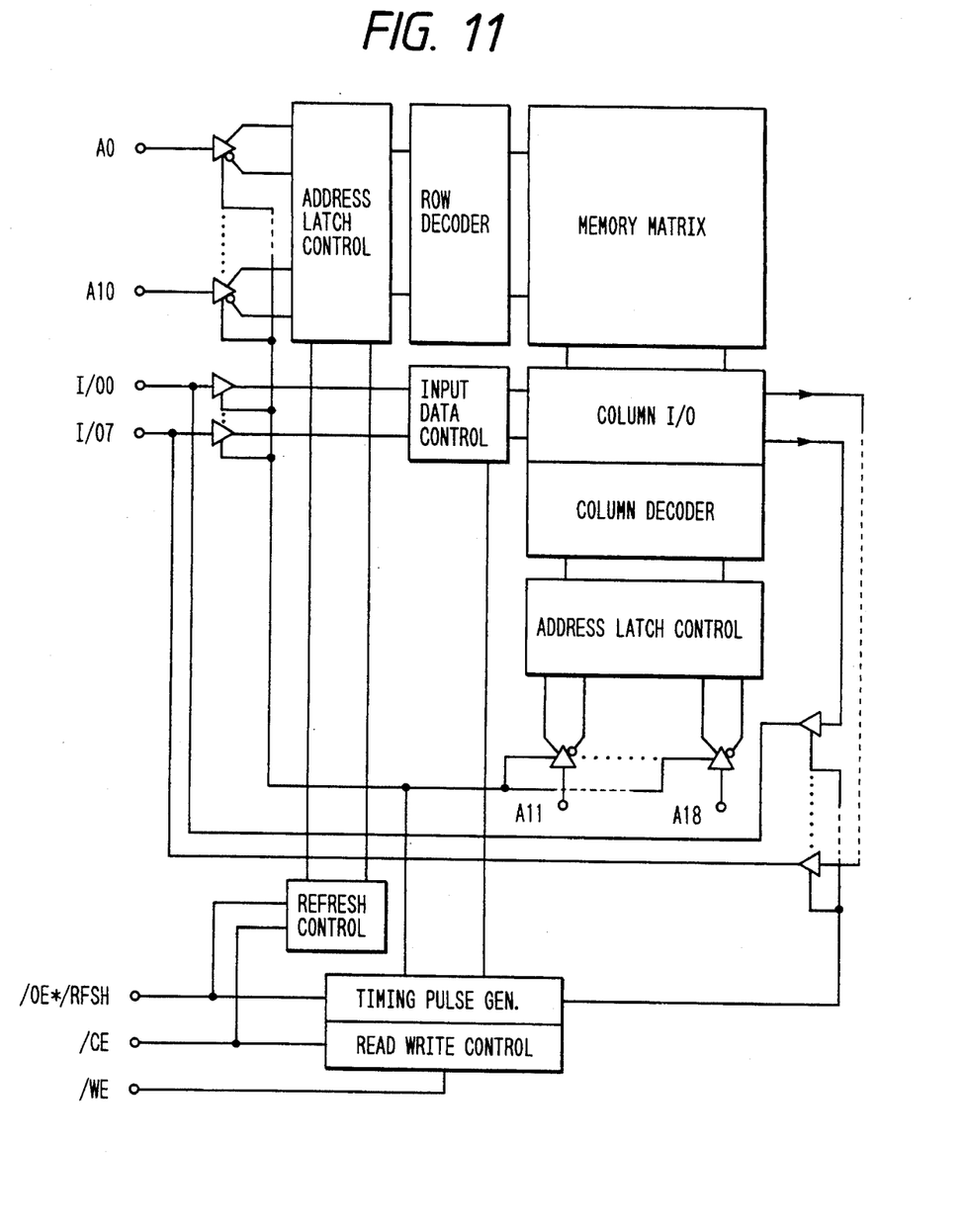
FIG. 11 is a block diagram of another embodiment of a semiconductor memory device applying this invention.

FIG. 11 shows a block diagram of another embodiment of a semiconductor memory device applying this invention. This embodiment is intended for a pseudo-static RAM whose external interface is compatible with the static RAM.

In this embodiment, address signals A0–A10 are taken into the address latch control circuit. The address signals A0–A10 are fed as an X-system address signal to the row decoder which forms a word line selection signal. Address signals A11–A18 are taken into the address latch control circuit and are fed as a Y-system address signal to a column decoder, which generates a selection signal for a column input/output circuit including a column switch. In this way, the external interface compatible with the static RAM is supplied X- and Y-system address signals from separate external terminals.

A memory matrix comprises, as in the previous embodiment, address selection MOSFETs and information storage capacitors formed of ferroelectric capacitors. A write signal input from the input/output terminals I/00–I/07 is taken into an input data control circuit and written through the column input/output circuit into selected memory cells in the memory matrix. A signal read through the column input/output circuit is output through the output buffer to the external terminals I/00–I/07.

A timing pulse generation circuit and a read/write control circuit determine the operation mode and generate a corresponding timing pulse in response to control signals supplied from the external terminals, /OE*/RFSH (output enable signal and refresh control signal), /CE (chip enable signal) and /WE (write enable signal). The control signal /OE*/RFSH is provided with two functions of the output enable signal and the refresh control signal at one external terminal.

The refresh control circuit may be formed as follows. That is, when the control signal /CE is high representing the chip unselect state and the /OE*/RFSH signal taken in as a refresh control signal is held low for a short period of time, the refresh control circuit increments the refresh address to perform the refresh operation for that duration; and when the /OE*/RFSH signal is held low for a long period of time, the refresh control circuit is activated by the pulse formed by the timer circuit to perform the refresh operation for that period.

The above-mentioned refresh control circuit and read/write control circuit are provided with a refresh activation circuit, a mode decision circuit, a continuous refresh operation number control circuit, a mode storage memory and a mode change circuit. The X-decoder includes a plate voltage drive circuit as part of the mode change circuit. In this way, the pseudo-static RAM, too, is automatically changed to the NV mode after the refresh operation has been performed a predetermined number of times consecutively, stopping the refresh operation of the word line. If all the word lines are set to the NV mode, virtually only the refresh timer circuit and address counter operate. This means that when the pseudo-static RAM is set to the information retaining state, a substantial reduction in power consumption can be realized. It is also possible to set the information retaining mode and the NV mode and at the same time to stop the operation of the timer circuit itself.

Figure 12:
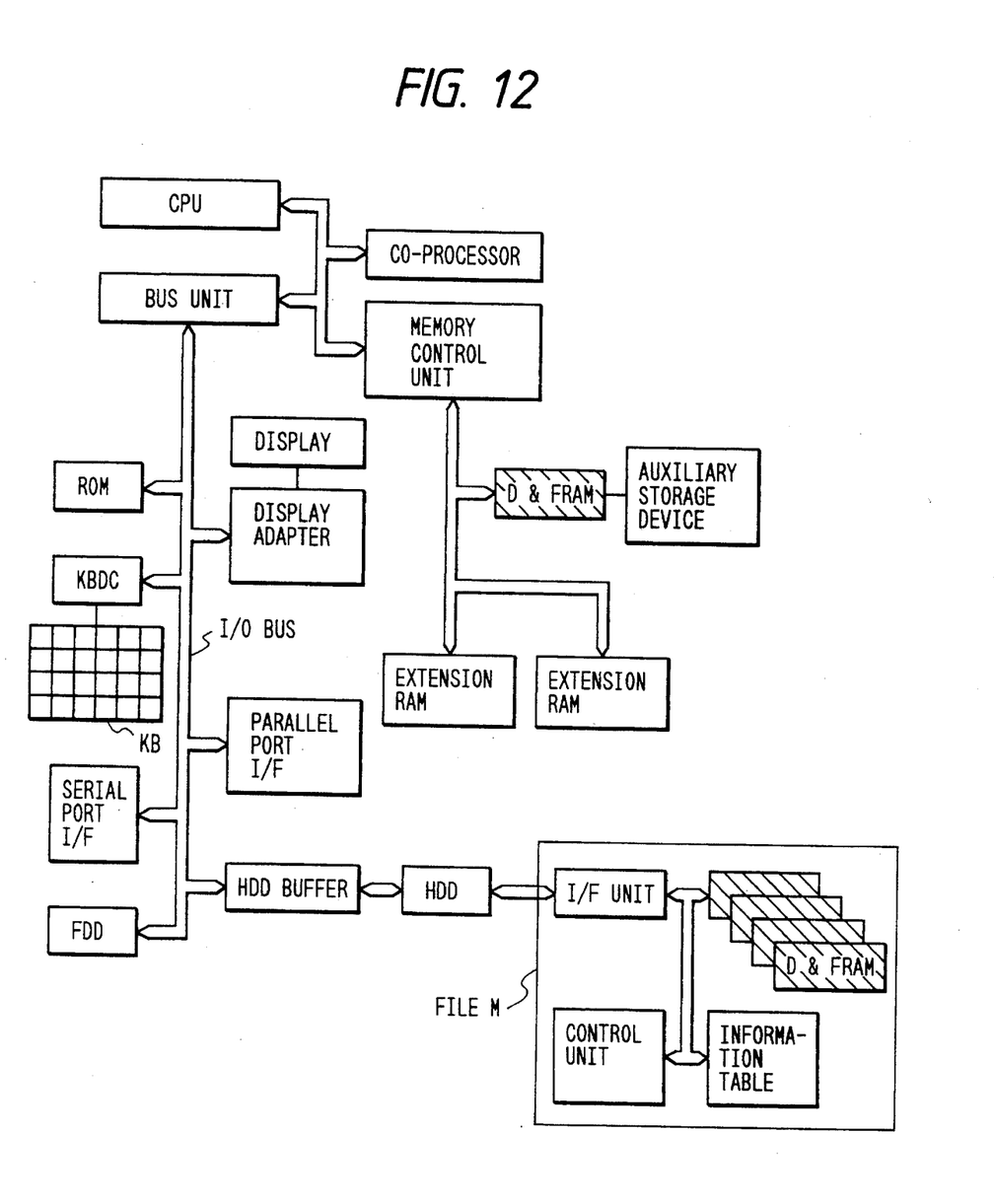
FIG. 12 is an outline of a computer system using the semiconductor memory device of this invention.

FIG. 12 shows an outline of a computer system using the semiconductor memory device (D&FRAM) of this invention. This computer system comprises a central processing unit CPU as an information processing device, an I/O bus built in the information processing system, a bus unit, a memory control unit that accesses high-speed memory such as a main memory and an extended memory, a D&FRAM as a main memory, a ROM containing the basic control program, and a keyboard controller KBDC connected to a keyboard.

A display adapter is connected at one end to the I/O bus and, at the other end, to a display. The I/O bus is connected with a parallel port I/F, a serial port I/F for mouse, a floppy disk drive FDD, and a buffer controller HDD buffer for converting data from I/O bus into HDDI/F. The memory control unit is connected to the extended RAM and the D&FRAM as a main memory.

Now, the operation of this computer system is explained. When power of the computer system is turned on, the CPU first accesses the ROM via the I/O bus to make an initial diagnostic and initial setting. Then, it loads the system program from the auxiliary storage device into the D&FRAM as a main memory. At the same time, the CPU activates the HDD controller through the I/O bus to access the HDD. When the system program is completely loaded, the CPU performs processing according to requests from the user.

The user performs input/output manipulations through the keyboard controller KBDC and the display adapter on the I/O bus. Input/output devices connected to the parallel port I/F and serial port I/F are used as necessary.

When the main memory capacity is insufficient, the lack in the capacity of the D&FRAM as a main memory is made up for by the extended RAM. When the user wishes to read a file, the user requests to access the auxiliary storage device assuming that the HDD is the auxiliary storage device. Then, the file memory system formed of the D&FRAM of this invention accepts that request and accesses the corresponding file data.

In the main memory D&FRAM, it is the usual case that not all the memory area is accessed but that only a very small part of the memory area is frequently accessed with the remaining part almost not accessed. In this case, because almost all the memory area is automatically set to the NV mode and cleared of the refresh operation, the power consumption is significantly reduced. In the case of the D&FRAM used in the file memory, the chance of being accessed is further reduced. Therefore, almost the entire area is set to the NV mode, omitting the refresh operation, which in turn leads to a substantial reduction in the current consumption.

For computer systems powered by battery, such as pen-input type and palm-top type, the use of the above-mentioned D&FRAM as their memory can achieve a significant reduction in power consumption and therefore prolong the battery life.

Figure 13:
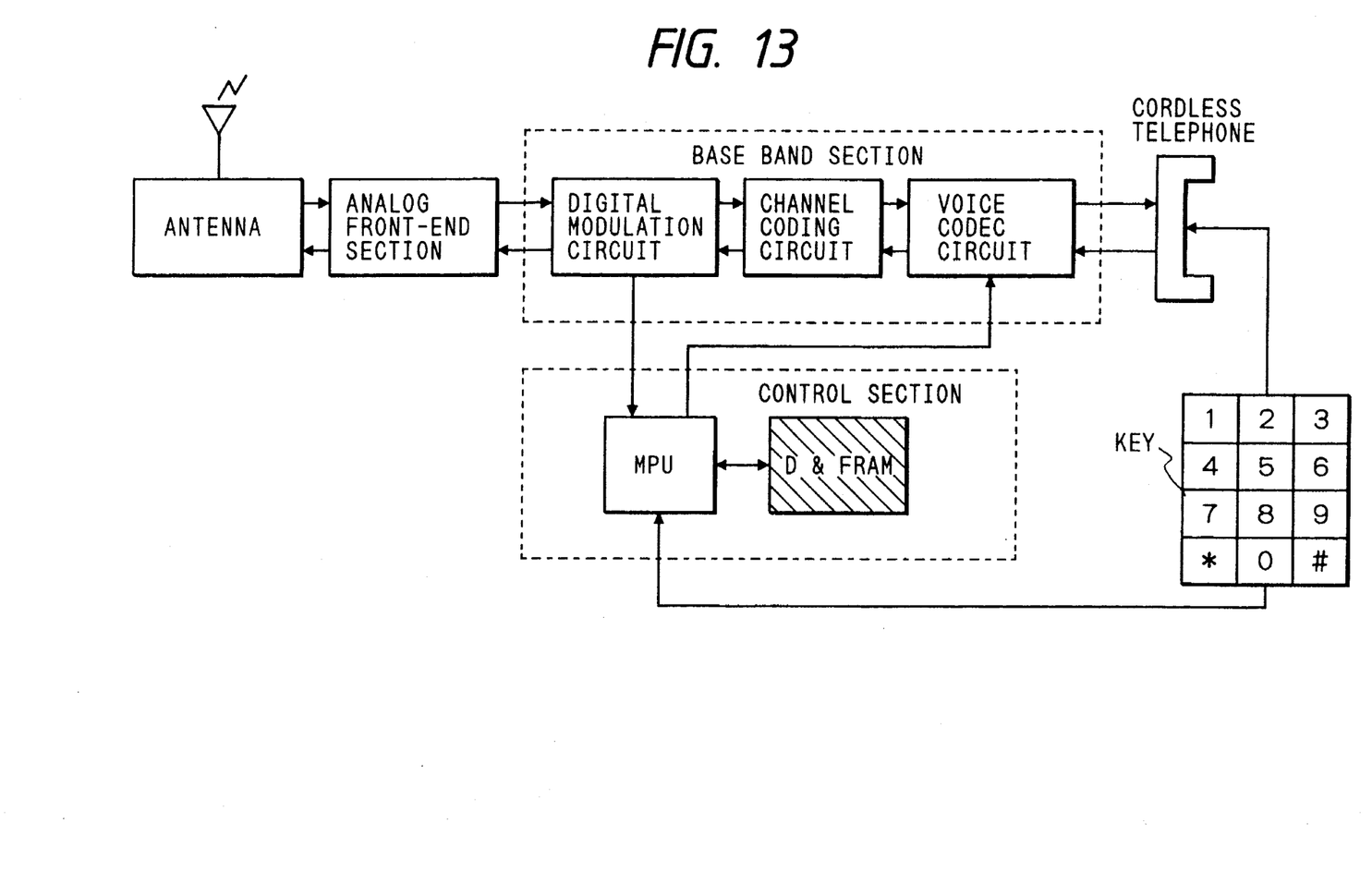
FIG. 13 is an outline of a cordless telephone system incorporating a semiconductor memory device of this invention.

FIG. 13 shows the outline of a cordless telephone system incorporating a semiconductor memory device (D&FRAM) of this invention. A radio wave received by an antenna is fed through an analog front end section to a digital modulation circuit in the base band section where it is subjected to waveform equalization and analog-digital conversion processing. An output signal from the digital modulation circuit is fed to the channel coding circuit which performs error correction and frame disassembly operations on the signal. An output signal from the channel coding circuit is sent to a voice codec circuit where it is subjected to a digital-analog conversion and voice extension before being supplied to a speaker of the cordless telephone.

How voice is transmitted by the cordless telephone system incorporating the D&FRAM of this invention will be explained below. Voice entered into the microphone of the cordless telephone is input to the voice codec circuit in the base band section where it is subjected to analog-digital conversion and voice compression. It is then sent to the channel coding circuit that performs error correction and frame assembly. The signal is then subjected to waveform equalization and digital-analog conversion before being transferred to antenna through the analog front end section.

In the control section comprising the microprocessor and the D&FRAM of this invention, both the microprocessor and the D&FRAM are connected with each other in bidirectional relationship. In response to a signal input from keys of the cordless telephone, the microprocessor performs control to write a speed dialing number and code into the D&FRAM of this invention. The microprocessor also reads out the speed dialing number and code stored in the D&FRAM of this invention.

The digital modulation circuit and the voice codec circuit are controlled by the microprocessor. In this way, the use of the FRAM of this invention in the control section of the cordless telephone realizes a size reduction of the control section and therefore a reduction in the size, weight and power consumption of the cordless telephone system. It also allows high-speed reading of a large quantity of information, improving the processing capability of the system as a whole. Further, the impact resistance, which is an essential point of the portable telephone, can be improved, enhancing the reliability of the cordless telephone system.

The features and advantages of the above embodiments are summarized as follows.

(1) A memory matrix—which comprises memory cells arranged in matrix, each made up of a ferroelectric capacitor and an address selection MOSFET—is divided for each word line into a plurality of memory blocks. Each of the memory blocks is provided with a mode storage circuit that stores a DRAM mode or NV mode in one-to-one correspondence for each memory block, and with a refresh operation count circuit that counts for each memory block the number of times the refresh operations is performed consecutively. During an n-th refresh operation (where n is a predetermined number of times), a memory access is made to temporarily change the plate voltage of the ferroelectric capacitor from one voltage to another and at the same time the mode storage circuit is changed from the DRAM mode to the NV mode. When a read or write operation to and from a memory cell in the memory block is performed, the mode storage circuit is changed from the NV mode to the DRAM mode. The refresh operation is omitted for the memory block that was set to the NV mode according to the stored information in the mode storage circuit. This operation allows a substantial reduction in power consumption and polarization is reversed only at time of switching to the NV mode, so that the limit on the number of rewriting operations can be virtually eliminated.

(2) The memory blocks are divided for each word line used for the refresh operation. The mode storage circuit is formed of a static memory having storage bits, each corresponding to one of the individual word lines. This configuration allows mode setting for each refresh address, thus realizing a significant reduction in power consumption.

(3) The refresh operation count circuit comprises: a memory circuit made up of a plurality of memory cells and sharing the word lines with the memory matrix; and a control circuit which, at each word line selection performed by the refresh operation, adds +1 to data read from the memory circuit and restores the result into the memory cell of the memory circuit and, at each word line selection performed by the read or write operation, resets stored information in the memory circuit. This permits the X-decoder circuit to be used commonly, allowing the mode setting for each word line by a simple configuration.

(4) In the same way that the memory blocks are divided, the plate is also divided so that only the corresponding plate is temporarily changed to the power supply voltage at time of switching from the DRAM mode to the NV mode. This permits the plate voltage drive circuit to be formed in a simple configuration and also reduces current consumption.

In the foregoing, the present invention has been described in connection with example embodiments. It is noted that this invention is not limited to the above embodiments but that various modifications may be made without departing from the spirit of the invention. The geometric arrangement and configuration of the memory array or memory matrix on the semiconductor substrate can take a variety of forms. For example, the memory array or memory matrix may be geometrically divided into memory blocks, with the word lines physically divided into a plurality of groups. When the memory array is divided into blocks, attention is focused not on the physical word lines but on the word lines simultaneously selected for the refresh operation and these simultaneously selected word lines are taken as a minimum unit in dividing the memory array into memory blocks. As a result, the reduction in power consumption because of the omission of the refresh operation during the NV mode can be realized efficiently in terms of circuitry. The plate voltage at time of switching to the NV mode may be changed temporarily to the ground potential of the circuit from the power supply voltage.

This invention has a wide range of applications where the memory device is basically made of pseudo-static RAMs which use dynamic RAMs or dynamic memory cells, have their external interface made compatible with the static RAMs and use ferroelectric capacitors in the memory cells.

Representative advantages of this invention may be summarized as follows. A memory matrix—which comprises memory cells arranged in matrix, each made up of a ferroelectric capacitor and an address selection MOSFET—is divided for each word line into a plurality of memory blocks. Each of the memory blocks is provided with a mode storage circuit that stores a DRAM mode or NV mode in one-to-one correspondence for each memory block, and with a refresh operation count circuit that counts for each memory block the number of times the refresh operations is performed consecutively. During an n-th refresh operation (where n is a predetermined number of times), a memory access is made to temporarily change the plate voltage of the ferroelectric capacitor from one voltage to another and at the same time the mode storage circuit is changed from the DRAM mode to the NV mode. When a read or write operation to and from a memory cell in the memory block is performed, the mode storage circuit is changed from the NV mode to the DRAM mode. The refresh operation is omitted for the memory block that was set to the NV mode according to the stored information in the mode storage circuit. This operation allows a substantial reduction in power consumption and polarization is reversed only at time of switching to the NV mode, so that the limit on the number of rewriting operations can be virtually eliminated.

Each memory block is assigned a single word line for the refresh operation. The mode storage circuit is formed of a static memory having storage bits, each corresponding to one of the individual word lines. This configuration allows mode setting, DRAM mode or NV mode, for each refresh address, thus realizing a significant reduction in power consumption.

The refresh operation count circuit comprises: a memory circuit made up of a plurality of memory cells and sharing the word lines with the memory matrix; and a control circuit which, at each word line selection performed by the refresh operation, adds +1 to read data from the memory circuit and restores the result into the memory cell of the memory circuit and, at each word line selection performed by the read or write operation, resets stored information in the memory circuit. This permits the X-decoder circuit to be used commonly, allowing the mode setting, DRAM mode or NV mode, for each word line by a simple configuration.

In the same way that the memory blocks are divided, the plate is also divided so that only the corresponding plate is temporarily changed to the power supply voltage at time of switching from the DRAM mode to the NV mode. This permits the plate voltage drive circuit to be formed in a simple configuration and also reduces current consumption.

We claim:

1. A semiconductor memory device comprising:

a memory matrix made up of memory cells arranged in matrix, each memory cell having a ferroelectric capacitor and an address selection MOSFET;

a plurality of memory blocks into which the memory matrix is divided every one or more word lines;

mode storage circuits provided in one-to-one correspondence for the memory blocks, the mode storage circuits storing a DRAM mode or an NV (non-volatile mode) mode;

refresh operation count circuits for counting the number of refresh operations performed consecutively for each memory block;

a mode change circuit which, during an n-th refresh operation (where n is a predetermined number of times), makes a memory access to temporarily change the plate voltage of the ferroelectric capacitor from one voltage to another and switches the mode storage circuit from the DRAM mode to the NV mode, the mode change circuit switching the mode storage circuit from the NV mode to the DRAM mode during a read or write operation on a memory cell in the memory block; and a mode decision circuit which omits the refresh operation on the memory block that was switched to the NV mode according to the stored information in the mode storage circuit.

2. A semiconductor memory device according to claim 1, wherein the memory blocks are divided for each word line used for the refresh operation, and the mode storage circuit is formed of a static memory having storage bits, each corresponding to one of the individual word lines.

3. A semiconductor memory device according to claim 2, wherein the refresh operation count circuit comprises: a memory circuit made up of a plurality of memory cells and sharing the word lines with the memory matrix; and a control circuit which, at each word line selection performed by the refresh operation, adds +1 to data read from the memory circuit and restores the result into the memory cell of the memory circuit and, at each word line selection performed by the read or write operation, resets stored information in the memory circuit.

4. A semiconductor memory device according to claim 3, wherein an external input interface is made compatible with a dynamic RAM.

5. A semiconductor memory device according to claim 3, wherein an external input interface is made compatible with a static RAM.

6. A semiconductor memory device according to claim 5, wherein in the same way that the memory blocks are divided, a plate is also divided so that only the corresponding plate is temporarily changed to a power supply voltage at time of switching from the DRAM mode to the NV mode.

* * * * *